United States Patent [19]

Chen et al.

[11] Patent Number: 5,704,536

[45] Date of Patent: Jan. 6, 1998

[54] AUTOMATIC BALL PLACING DEVICE

[75] Inventors: Meng-Chun Chen, Tainan; Weng-Jung Lu, Hisinchu, both of Taiwan

[73] Assignee: Industrial Technology Research Institute, Hsin Chu, Taiwan

[21] Appl. No.: 615,556

[22] Filed: Mar. 12, 1996

[51] Int. Cl.⁶ .................. H05K 3/30; B23K 3/06
[52] U.S. Cl. .................. 228/41; 228/246; 221/269
[58] Field of Search .................. 228/41, 56.3, 180.22, 228/246, 254; 437/183; 427/96; 221/268, 269

[56] References Cited

U.S. PATENT DOCUMENTS

| | | | |
|---|---|---|---|
| 5,431,332 | 7/1995 | Kirby et al. | 228/246 |
| 5,482,736 | 1/1996 | Glenn et al. | 437/96 |

*Primary Examiner*—Samuel M. Heinrich
*Attorney, Agent, or Firm*—W. Wayne Liauh

[57] ABSTRACT

An automatic ball placing device can automatically attach the solder ball to the pad of BGA's (Ball Grid Array) substrate. It comprises mainly a BGA substrate fixing device, a stencil fixing seat at least, a horizontal driving device, a vertical driving device and a swinging device. The BGA substrate possesses multiple stencil. The horizontal driving device and the vertical driving device can drive the said BGA substrate fixing device to perform horizontal and vertical movement respectively so as to move the BGA substrate to the position below the stencil fixing seat and thereby, make the solder balls drop into the mesh of the stencil which facilitates the solder balls to attach to the pad of BGA's substrate.

9 Claims, 13 Drawing Sheets

```
┌─────────────────────────────────────┐
│ A LAYER OF FLUX IS PRINTED ON       │
│ THE PAD OF BGA SUBSTRATE BY         │
│ A STENCIL                           │
└─────────────────────────────────────┘
                  │
                  ▼
┌─────────────────────────────────────┐
│ BY MEANS OF THE VISCOSITY OF THE    │
│ FLUX SOLDER BALLS ARE ATTACHED      │
│ TEMPORALLY ON THE PAD OF BGA        │
│ SUBSTRATE                           │
└─────────────────────────────────────┘
                  │
                  ▼
┌─────────────────────────────────────┐
│ THE BGA SUBSTRATE WITH SOLDER       │
│ BALLS ATTACHED IS TREATED BY        │
│ REFLOWING WHICH MAKES THE           │
│ SOLDER BALLS PERMANENTLY            │
│ ATTACH TO THE PAD OF THE            │
│ BGA SUBSTRATE                       │
└─────────────────────────────────────┘
                  │
                  ▼
┌─────────────────────────────────────┐
│ BGA SUBSTRATE IS TAKEN OUT          │
└─────────────────────────────────────┘
```

F I G. 3A
(PRIOR ART)

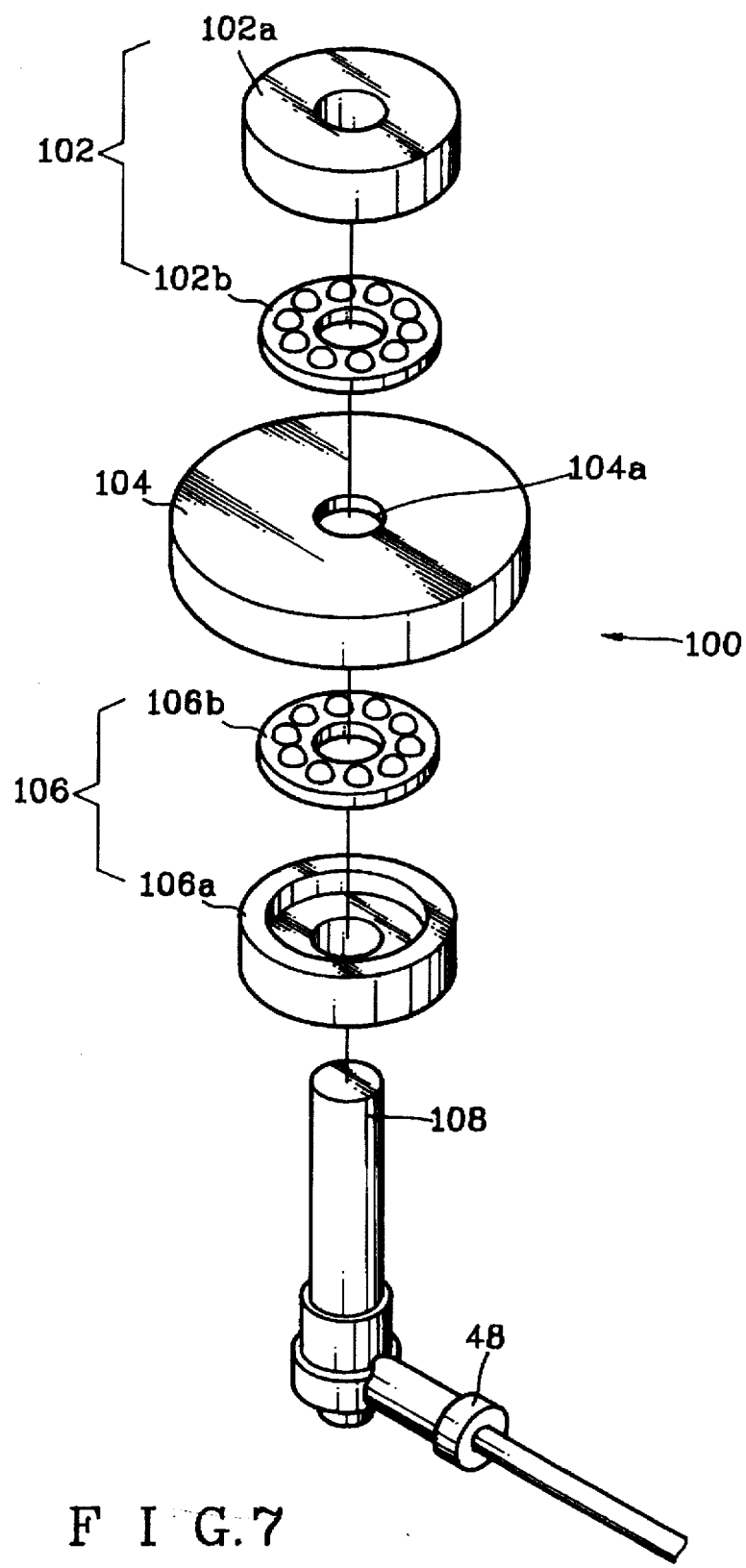
F I G. 7

1

AUTOMATIC BALL PLACING DEVICE

FIELD OF INVENTION

The present invention is related to an automatic ball placing device, especially indicating a ball placing device applied in the BGA process techniques.

BACKGROUND OF THE INVENTION

The common ICs all have leads which make IC easy to attach to the PCB (see FIG. 1A attached), but there are limited leads available in this type of IC and their electrical and heat-conductive characteristics are poor. Another type of ICs of today are gradually rampant (see FIG. 1B attached). This type of ICs possess a Ball Grid Array (BGA) connectors (which are equivalent to the common leads) which are soldered by the solder balls and are generally consists of a substrate, hence we call this type of IC together with the substrate a Ball Grid Array substrate or simply BGA substrate. FIG. 2 is the section view of BGA substrate having been soldered with solder balls where C is an IC chip, F is a substrate with solder balls soldered to the pad P of it. Besides having more connecting points, this type of IC has better electrical and heat-conductive characteristics as well as wider connector intervals.

FIG. 3A is the manufacturing technique flow chart of BGA. At first, a layer of flux is printed on the pad of BGA substrate by a stencil. By means of the viscosity of the flux, solder balls are attached temporally on the pad of BGA substrate. Afterwards, the BGA substrate with solder balls attached is treated by a reflow oven which makes the solder balls permanently attach to the pad of the BGA substrate. Finally, the BGA substrate is taken out.

But currently the process 2 of the solder ball placing technique in FIG. 3A is generally performed manually as shown in FIG. 3B. The BGA substrate F is placed in fixture J and then covered by stencil M. Solder bails B are then placed on stencil M. The whole device is then shaken horizontally back and forth such that the solder balls are dropped through the holes on the stencil and attached to the pads of the BGA substrate. This method has the following shortcomings:

(A) It wastes time in ball placing;
(B) The quality is not guaranteed;
(C) It is unable to integrate the manufacturing process to perform automation.

In order to overcome the above-mentioned shortcomings, somebody developed a automatic ball placing technique (see FIG. 4) which makes use of the vacuum suction head K with a vacuum source V to suck solder balls B and attaches them to the pads P of BGA substrate F. However, this method has the following shortcomings:

(A) Oftentimes, there is a phenomenon that the suction head does not suck all of the solder balls (as shown in the figure the cavity G of the suction head K does not suck the solder ball)
(B) The more solder balls to sucked the more energy of vacuum source to be consumed
(C) There are some occasion, such as the shape of solder balls deform a little bit or solder balls stick on the suction head due to the electrostatic, that solder balls will not be able to attach to the BGA substrate.

In view of the disadvantages of the above-mentioned ball placing techniques of the BGA substrate, the authors of the present invention performed in detailed studies and developed a new automatic ball placing device to manufacture IC in good quality that can integrate the up-and-down stream production line to realize automation which can not only save manpower but also maintain consistent ball placing quality.

SUMMARY OF THE INVENTION

The main purpose of the present invention is to provide an automatic ball placing device to integrate the production line, thereby to realize automation which can save manpower as well as maintain consistent quality of ball placing. As for the other advantages and purposes, it can be understood by reading the following illustration with drawings attached.

BRIEF DESCRIPTION OF THE DRAWINGS

FIG. 3A is the flowchart of BGA's manufacturing technique.

FIG. 7 is the structure of the micro-floating connecting head.

DETAILED DESCRIPTION OF THE INVENTION

Figure 1B:
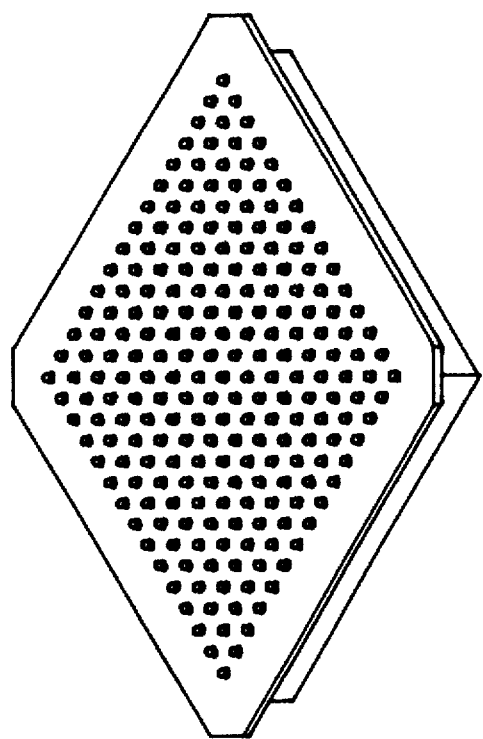
FIG. 1B shows BGA substrate's lead connecting.
Figure 1A:
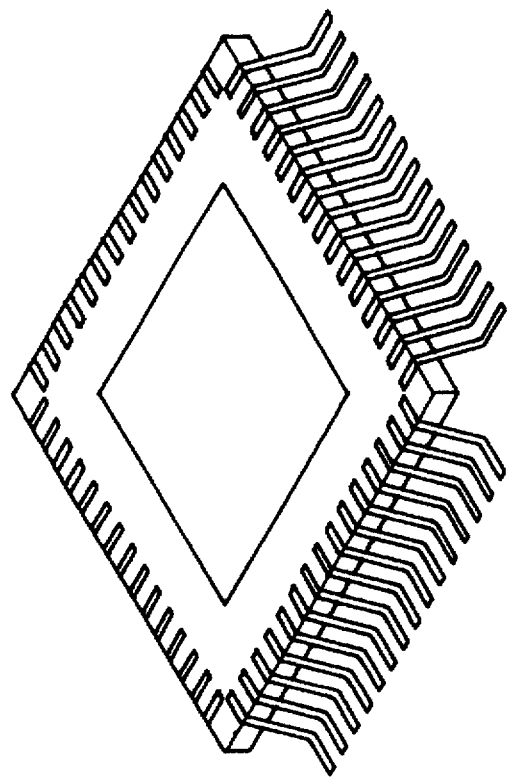
FIG. 1A shows traditional way of ICs' lead connecting.
Figure 2:
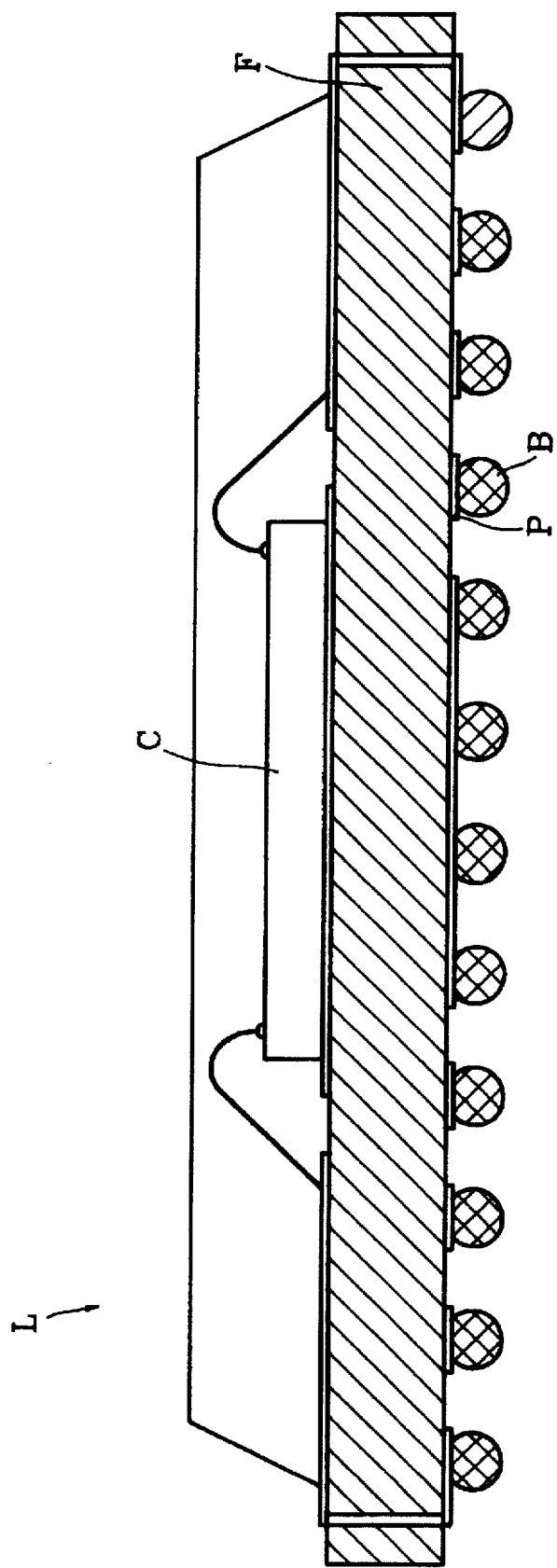
FIG. 2 is the cross-section view of BGA substrate.
Figure 3B:
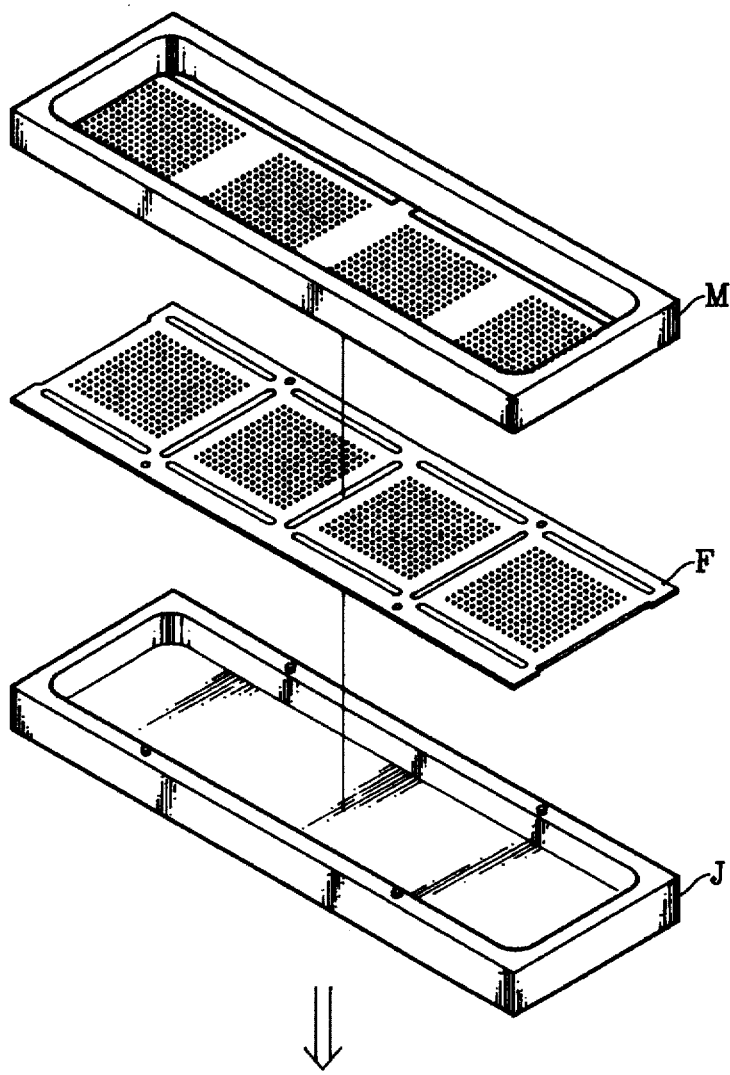
FIG. 3B is the ball placing technique of BGA substrate using manual swinging method.
Figure 3B:
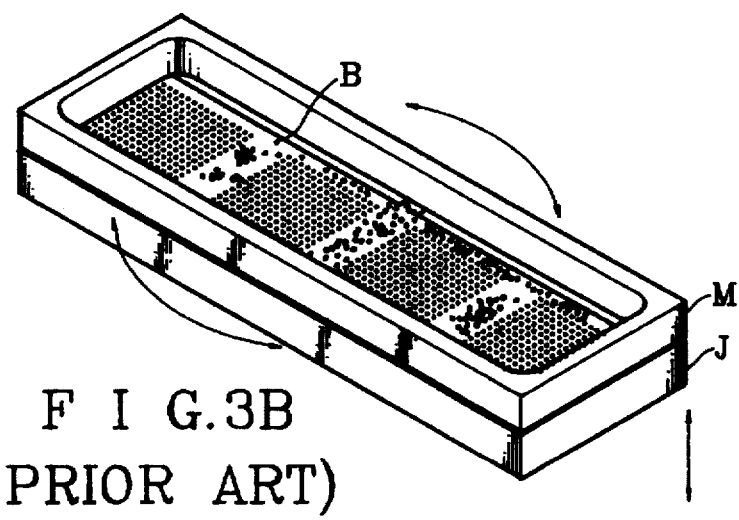
Figure 4:
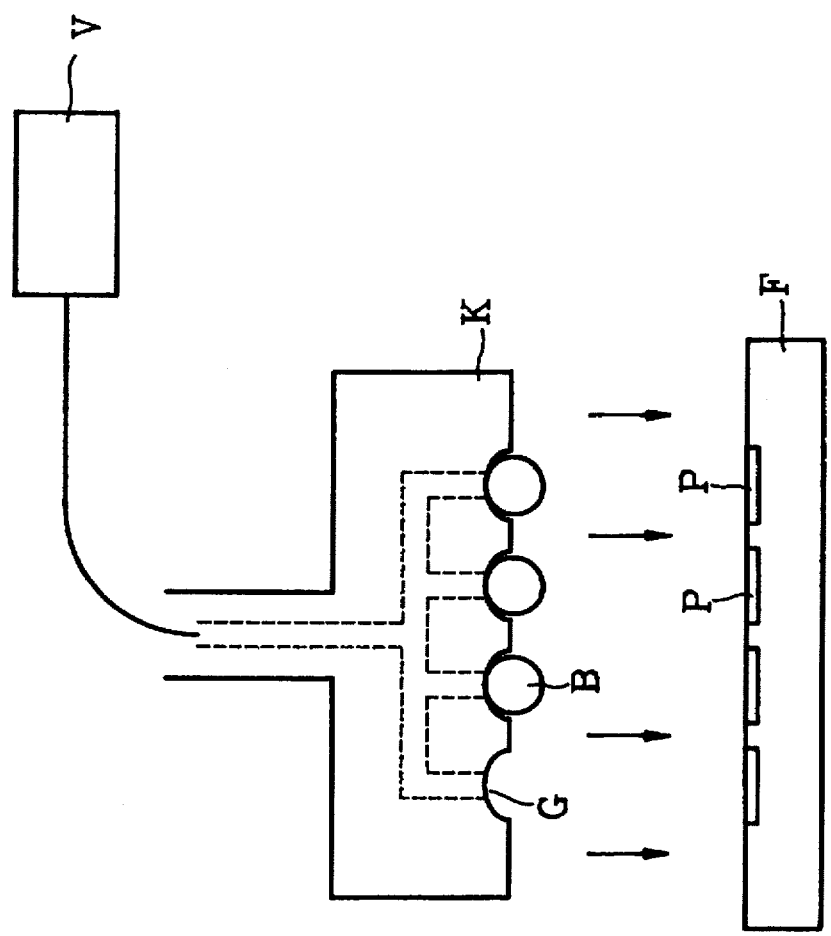
FIG. 4 is the ball placing technique of BGA substrate using vacuum suction method.
Figure 5:
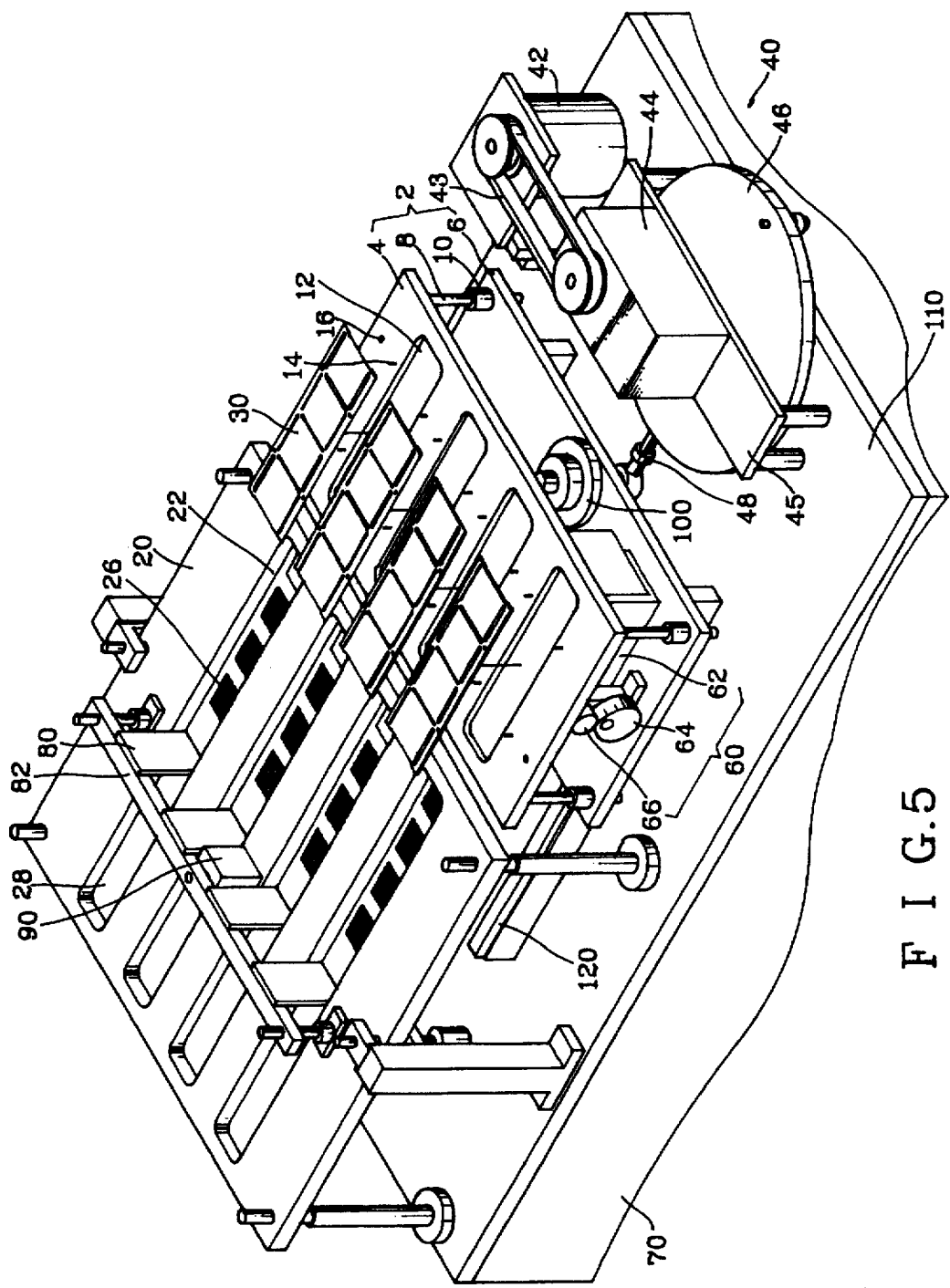
FIG. 5 is the isometric view of automatic ball placing device of the present invention.

The automatic ball placing device shown in isometric drawing as referring to FIG. 5 comprises mainly a base (110), a BGA substrate fixing device (2), a stench fixing seat (20), a horizontal driving device (40), a vertical driving device (60) and a swinging device (70) where the BGA substrate fixing device (2) and the horizontal driving device (40) are installed on the base (110); and the vertical driving device (60) is installed on the moving platform (6) of the BGA substrate fixing device (2) while the swinging device

Figure 8:
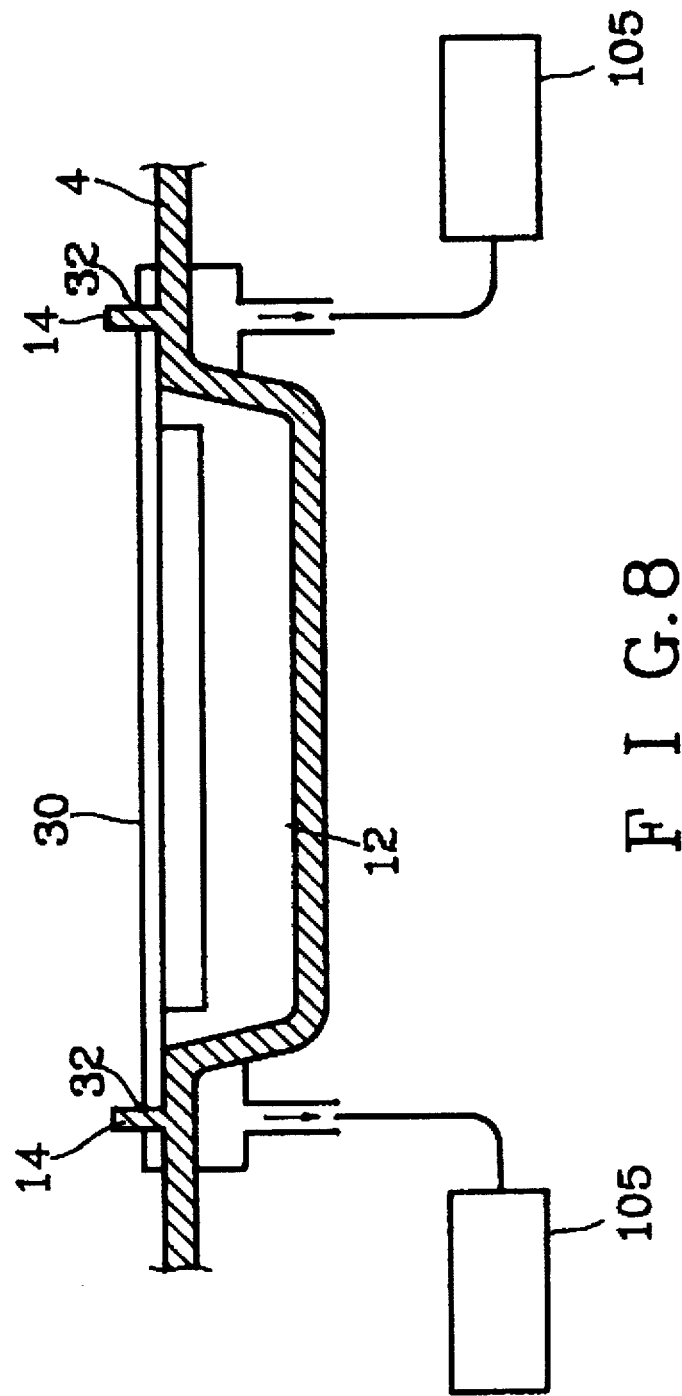
FIG. 8 is the schematic drawing showing the situation while the BGA substrate is fixed on the medium length concave of the accepting platform of the BGA substrate's fixing device.

(70) is installed under the base (110). As shown in the Figure the BGA substrate fixing device (2) comprises a carrier (4), a moving platform (6) and several rods (8). One end of the rods are connected to the carrier (4) and the other end are inserted into the sleeve (10) such that the rods can slide freely in them to enable the relative movement between the carrier (4) and moving platform (6). There are several first concaves (12) made on the carrier (4). Each has several fixing pins (14) to fix the BGA substrate (30) (refer to FIG. 8); the BGA substrate (30) is fixed on the carrier (4) via the holes on the BGA sustrate and fixing pins on the carrier (4). There are several small holes joined to vaccum (105) on the carrier (4). By way of vaccum, the BGA substrate (30) is fixed on the carrier (4) firmly. The BGA substrate fixing device (2) with its moving platform (6) is mounted on a pair of guided rails (120) which are installed on the base (110). Then, the BGA substrate fixing device (2) can slide horizontally along the guided rail (120).

Referring again to FIG. 5, the stencil fixing seat comprises several second concaves (22). Each has a gate (80) which separate the second concave (22) into two parts. One part is stencil with meshes which the solder balls desired to be attached can pass through. The other part is the solder balls storage area. All the gates (80) are fixed at the same connecting frame (82) and the pneumatic cylinder (90) makes the gates open or close. Besides, multiple positioning pins (not shown in the figure) are located on the back of the stencil fixing seat (40). The multiple positioning holes (16) on the carrier (4) match those positioning pins to let the carrier (4) be in the right position.

In order to facilitate the positioning pins of the stencil fixing seat(20) to embed into the positioning holes (16) of the carrier(4), the automatic ball placing device of the present invention offers a micro-floating connector (100). This connector is mounted on the moving platform (6) of the BGA substrate's fixing device (2) and is connected to the horizontal driving device (40). Referring to FIG. 7, the micro-floating connector (100) comprises an upper ball ring (102), a micro-floating disk (104), a lower ball ring (106) and a journal (108); the said upper ball ring (102) consists of a ball ring (102b) and a ball ring cover (102a) and the lower ball ring (106) also consists of a ball ring (106b) and a ball ring cover (106a); one end of the journal (108) is connected to the connecting link (48) of the horizontal driving device (40) and the other end is penetrated through a hole on the moving platform (6) and slipped on sequentially the center holes of the lower ball ring (106), micro-floating disk (104) and the upper ball ring (102); among them, the center hole (104a) of the micro-floating disk (104) is slightly greater than the outer diameter of the journal to let the moving platform (6) move back and forth a little relative to the journal (108). Therefore, the compliance characteristic makes the positioning pins on the back of the stencil seat (20) easy to embed into the positioning holes on the carrier (4).

Figure 6A:
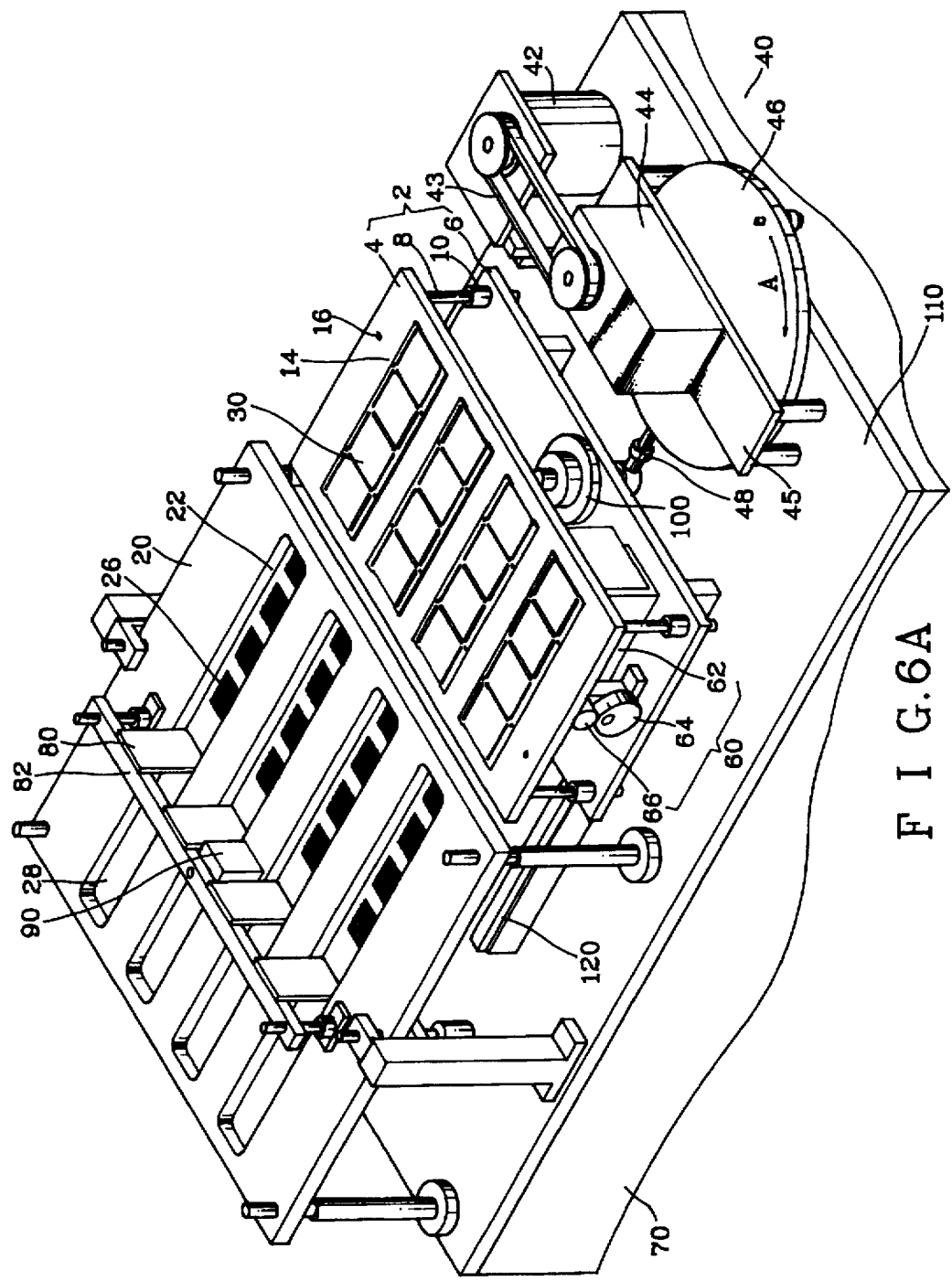
FIG. 6A is the isometric view of automatic ball placing device of the present invention showing the situation while the BGA substrate is installed (currently at the top dead point location).
Figure 6B:
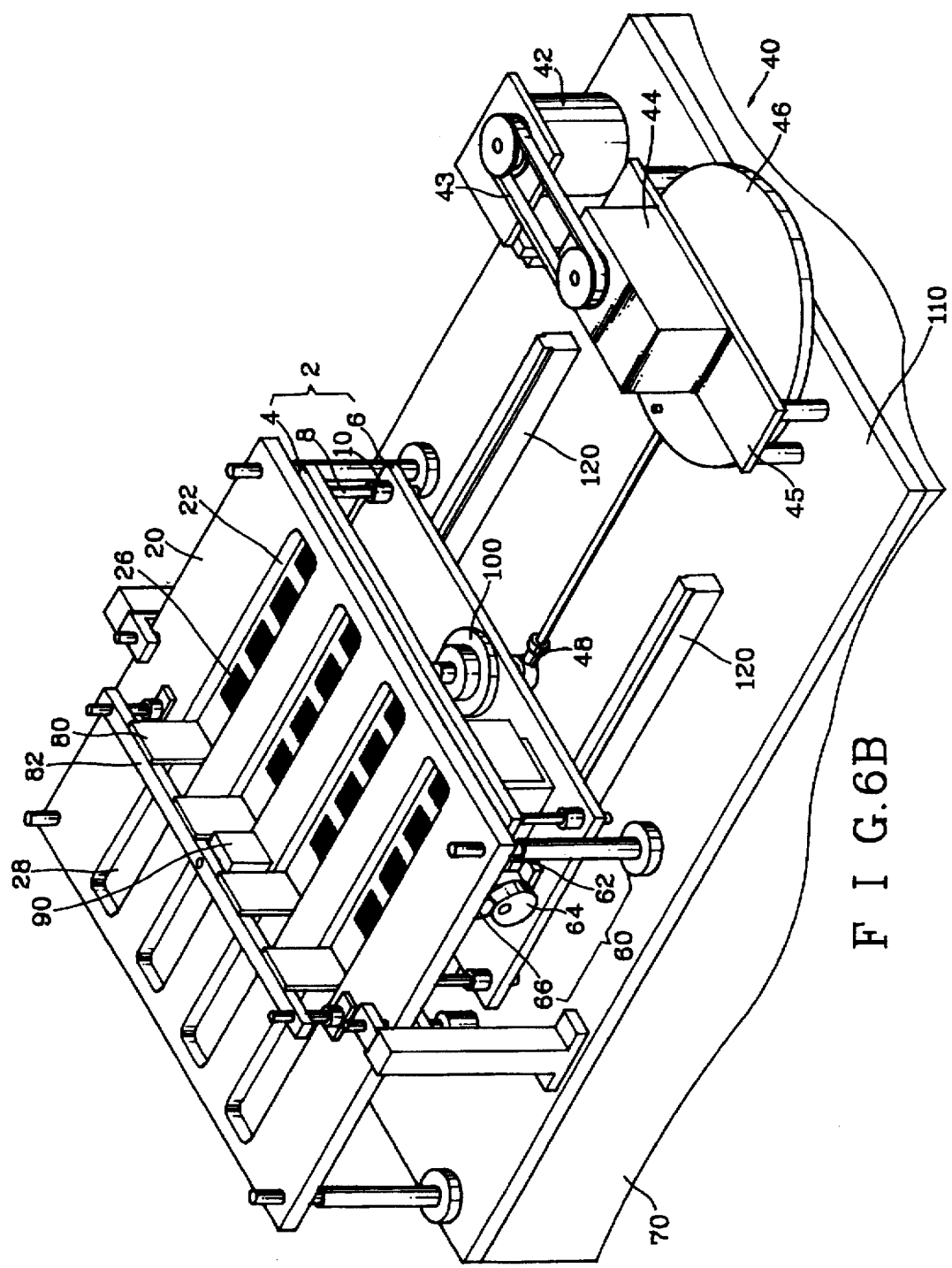
FIG. 6B is the isometric view of automatic ball placing device of the present invention showing the situation while the BGA substrate fixing device is moved to the position under the stench by the horizontal driving device (currently at the top dead point location).

Referring back to FIG. 5, the horizontal driving device (40) comprise a first driving motor (42), a indexing device (44) and a slider-crank mechanism (not labeled in the figure). The slider crank mechanism consists of a crank disk (46), connecting link (48) and substrate fixing device (2). Via the connection of joints and micro-floating connector (100), the rotation of the crank disk (40) drive the substrate fixing device (2) to perform reciprociating motion. The indexing device (44) can be driven by the first driving motor (42) by means of a belt (43) or can be driven directly by the first driving motor (42); the indexing device (44) can then drive the crank disk (46) to rotate and make the BGA substrate's fixing device (2) perform horizontal movement. Because of the characteristic of the indexing device the first driving motor (42) rotates a revolution (i.e. 360 degree) and the crank disk (46) rotates exactly a half revolution (i.e. 180 degree). This makes the BGA substrate fixing device (2) move from the upper dead point (i.e. the position shown in FIGS. 5 and 6A) to the lower dead point (i.e. the position shown in FIG. 6B). Besides, the velocity and acceleration of the slider-crank mechanism (not labeled) are zero at the upper dead point and the lower dead point respectively. This characteristic can avoid the impact to the BGA substrate fixing device (2) caused by the horizontal driving device. Therefore, the solder balls on the BGA substrate (30) are not shifted.

Figure 9:
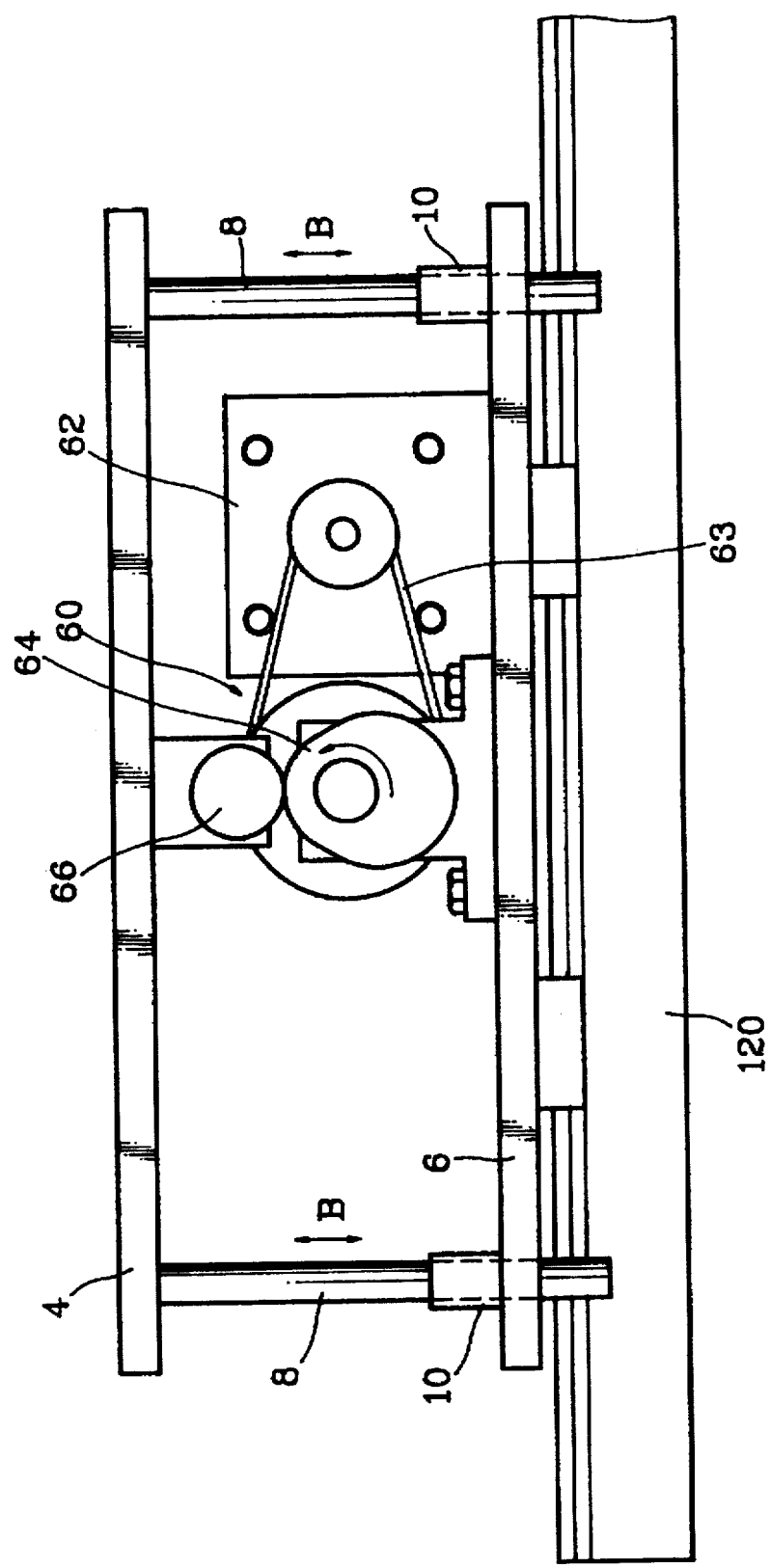
FIG. 9 is the schematic drawing showing the action of the vertical driving device of the automatic ball placing device of the present invention.

Referring again to FIG. 5, the vertical driving device (60), which is installed on the moving platform (6) of the BGA fixing device (2), consists of a second driving motor (62), a cam (64) and a cam follower (66). Referring to FIG. 9, both cam (64) and the second driving motor (62) are fixed on the moving platform (6), while the camfollower (66) is installed beneath the carrier (4); the second motor (62) drives the cam (64) through a belt (63) to make the carrier (4) move up and down as shown in the arrowhead sign B. The motion curve of the cam (64) of the present invention can make the instantaneous velocity smooth enough at the instant the carrier (4) leaves the stencil fixing device (20) so that the solder balls will not be shifted. The soldering quality of the solder balls is guaranteed.

The operation of the automatic ball placing device of the present invention is as follows. First, the BGA substrate (30) is fixed on the carrier (4) (refer to FIG. 6A). At this moment, the BGA substrate fixing device (2)locates exactly at the upper dead point, then the crank disk (46) is made to rotate (in the direction show by the arrow head A) by the indexing device (44) driven by the first driving motor (42). Therefore, the BGA substrate fixing device (2) is moving along the guided rail (120) and will reach the position beneath the stencil fixing seat(20). As the first driving motor (42) rotates one revolution, the crank disk (46) rotates exactly a half revolution or 180 degree. At this moment, the BGA substrate fixing device (2) is moved exactly to the lower dead point (as shown in FIG. 6); thereafter, the carrier(4) is make to move upward by the cam (64) driven by the second driving motor (62). The positioning pins (not labeled) on the stencil fixing seat embed into the positioning holes (16) on the carrier(4) and the career (4) locate exactly below the stencil fixing seat(20) and keep a gap with the stencil (26); also, every mesh on the stencil corresponds exactly to the pads of the BGA substrate (30) to facilitate the solder balls to attach to each pads. Also, the gap between the stencil (26) and BGA substrate (30) can be adjusted by a screw. By adjusting the height of the stencil fixing seat(20), to adapt to various size of the solder balls.

Figure 6C:
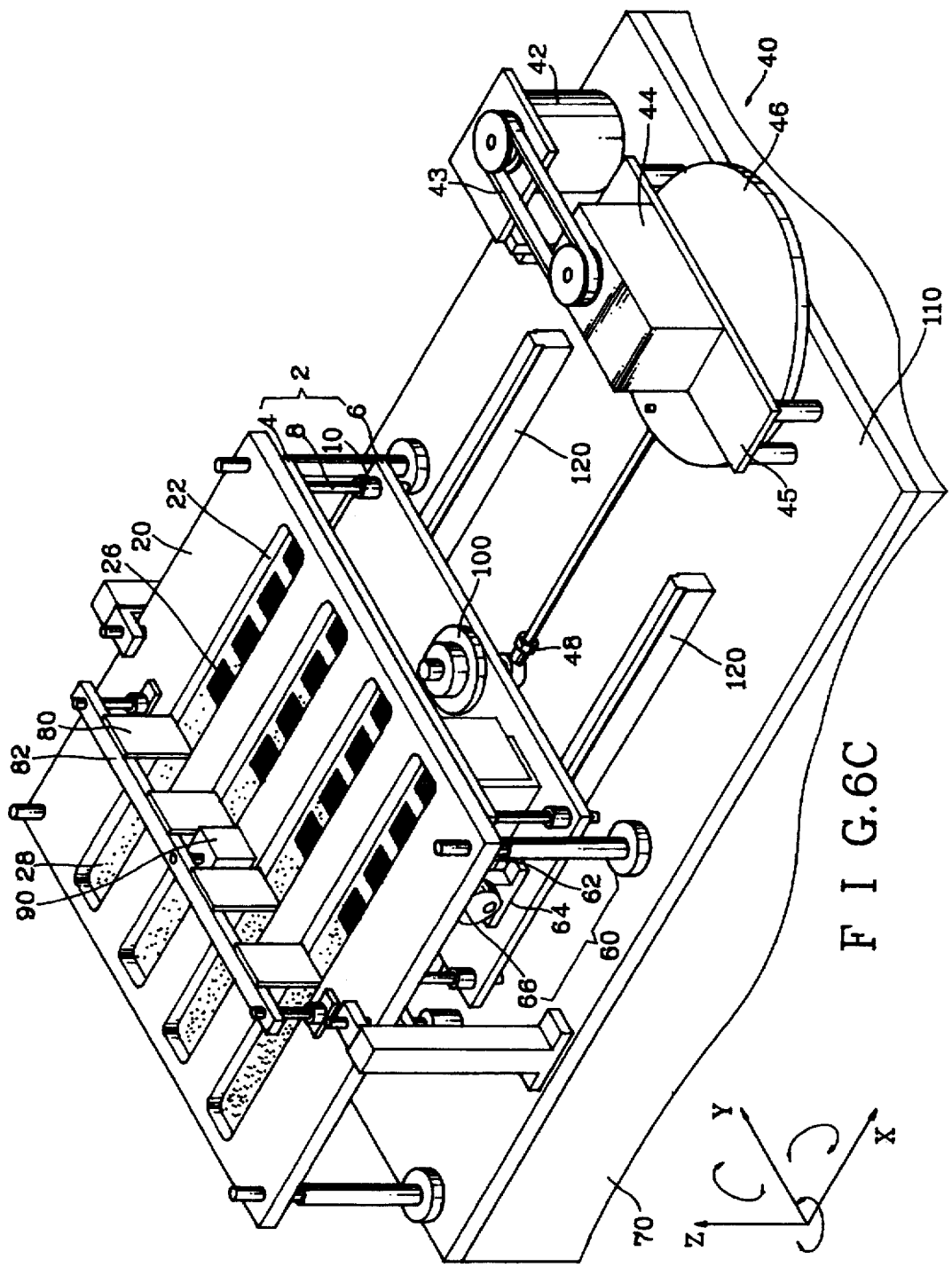
FIG. 6C shows the automatic ball placing device of the present invention while the swinging device starts to swing and ready to attach the solder balls to the pads of BGA substrate.
Figure 6D:
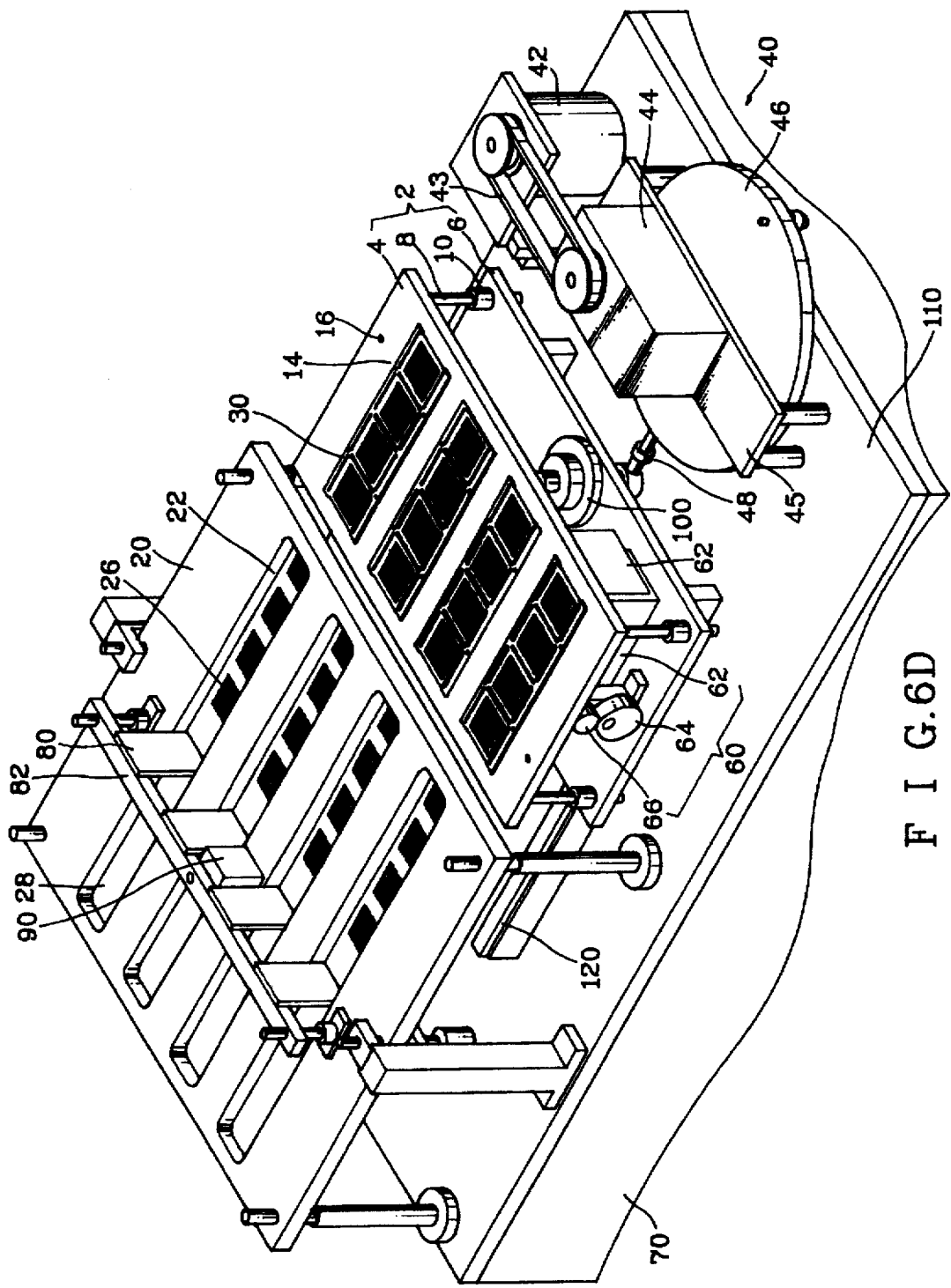
FIG. 6D shows the automatic ball placing device of the present invention while the BGA substrate with solder balls already attached is moved back to the location where it was installed (i.e. at top dead point location).

The solder balls are supplied to the solder balls storage area (28) (as shown in FIG. 6c) and are rolling onto the stencil (26) by opening the gate (80) and the action of swinging device. The solder balls pass through the meshes (not labeled) and finally dropped on the pads of BGA substrate (30) and attached to the pads by the up, down and circular oscillation of the swinging device (the arrowhead directions as shown in the Figure). As the swinging device (70) stops swinging, the swinging device (70) can keep an inclined angle to facilitate the solder balls remaining on the stencils to roll back to the solder ball storage area (28); at this moment, the pneumatic cylinder is restarted to close the gate (80) to keep the solder balls from rolling back onto the stencil (26).

Afterwards, the second driving motor (62) can drive the cam (64) which makes the carrier(4) descends back to the original altitude (i.e. the carrier's (4) altitude when the BGA substrate (30) was installed), then to take out the BGA substrates (30) already attached. In this way, same operation as shown above is repeated constantly and solder balls will constantly attach to the BGA substrates (30).

The slider-crank mechanism of the present invention as stated above has the characteristics of zero velocity and zero acceleration at the upper dead point and lower dead point positions respectively, therefore can keep the BGA substrate (30) from being vibrated and cause the shift of the solder balls. Also the curve of the cam in the present invention can make the instantaneous velocity smoother while the BGA substrate (30) separates from the stencil fixed seat(20) without resulting in creating shift of the solder balls, thereby, can improve the ball placing quality of IC.

Summarizing the foregoing statements, the "automatic ball placing device" has the following advantages:

(a) The automatic ball placing device of the present invention can integrate the front and rear manufacture process automation to save manpower and maintain consistency of ball placing quality.

(b) The velocity and acceleration are zeros at the upper dead point and lower dead point respectively of the slider-crank mechanism in the horizontal driving device of the automatic ball placing device of the present invention to refrain the BGA substrate from oscillating that results in the shift of solder balls.

(c) The curve design of the cam in the vertical driving device of the automatic ball placing device of the present invention can make the instantaneous velocity smoother at the moment the BGA substrate separate from the stencil fixing seat without causing the shift of the solder balls.

Therefore, "the automatic ball placing device" of the present invention is practical, up-to-date and progressive and is in accordance with the requirements of the patent law.

Although the present invention has been illustrated and described previously with reference to the preferred embodiments thereof, it should be appreciated that it is in no way limitted to the details of such emgbodiments, but is capable of numerous modification within the scope of the appended claims.

What is claimed is:

1. An automatic ball placing device, which can automatically attach solder balls to the pads of BGA substrate with said pads fixed on said BGA substrate, comprising:

a swinging device;

a base set up on said swinging device;

a horizontal driving device set up on said base to perform horizontal reciprocating motion;

a BGA substrate fixing device set up on said horizontal driving device to fix said BGA substrate;

a vertical driving device set up on said BGA substrate fixing device to perform vertical reciprocating motion;

a stencil fixing seat set up on said base with said BGA substrate fixing device attached below.

2. An automatic ball placing device as claimed in claim 1, wherein said BGA substrate fixing device further comprises:

a carrier having at least a first concave that can carry said BGA substrate;

multiple rods connecting to said carrier; and a moving platform having multiple of sleeves which contain said supporting rods, connecting to said horizontal driving device.

3. An automatic ball placing device as claimed in claim 2, wherein the edge all around said first concave of said carrier has multiple fixing pins set up which can embed into multiple fixing holes along the edge of the BGA substrate; and there are multiple small holes set between said fixing pins; and a vacuum device is installed under said carrier to fix said BGA substrate.

4. An automatic ball placing device as claimed in claim 2, wherein multiple positioning pins are set up underneath said stencil fixing seat and there are multiple positioning holes set up on said carrier and said multiple positioning pins can embed into said multiple positioning holes to facilitate fixing said BGA substrate at a position under each of the stencil of said stencil fixed seat, thereby, each of the mesh of the said stencil corresponds to every pad of said BGA substrate to facilitate solder balls to attach on said pads of said BGA substrate.

5. An automatic ball placing device as claimed in claim 1, wherein said horizontal driving device comprises:

a first driving motor;

an indexing device driven by said first driving motor;

a fixing frame installed on said substrate to support said indexing device; and a slider-crank mechanism further comprising a crank disk and a connecting link, and said crank disk connected to said indexing device while said connecting link connected to said BGA substrate fixing device.

6. An automatic ball placing device as claimed in claim 5, wherein a micro-floating connector is set up on said connecting link and said micro-floating connector comprises an upper ball ring, a micro-floating disk, a lower ball ring and a journal; both said upper ball ring and said lower ball ring consist of a ball ring and a ball ring cover and one end of said journal is hinged to said connecting link of said said horizontal driving device and the other end passes through one of the hole of the said moving platform and is slipped on by said lower ball ring, said micro-floating disk and a center hole of said upper ball ring; said center hole of said microi-floating disk is slightly greater than the outer diameter of said journal which enables said moving platform to move a little bit relatively to said journal to facilitate said positioning pins of said stencil fixing seat to embed into the positioning holes of said carrier.

7. An automatic ball placing device as claimed in claim 2, wherein said vertical driving device comprises:

a cam fixed on said moving platform;

a cam follower fixed underneath said carrier and connected to said cam; and a second driving motor fixed on said moving platform to drive to rotate said cam, thereby, enabling said carrier to perform up-and-down motion.

8. An automatic ball placing device as claimed in claim 1, wherein a second concave with a gate is set up on said stencil fixing seat; said gate divides said second concave into two parts wherein one part has a stencil set up and another part is a solder balls storage area; and said gate can open and close by use of a pneumatic cylinder to facilitate supplying solder balls onto said stencil to perform the attachment of solder balls.

9. An automatic ball placing device as claimed in claim 1, wherein a guiding rail is set up on said base and said guiding rail is mounted on by said BGA substrate fixing device.

* * * * *